United States Patent [19]
Jost et al.

[11] Patent Number: 5,966,611
[45] Date of Patent: Oct. 12, 1999

[54] SEMICONDUCTOR PROCESSING FOR FORMING CAPACITORS BY ETCHING POLYSILICON AND COATING LAYER FORMED OVER THE POLYSILICON

[75] Inventors: Mark E. Jost; Bradley J. Howard, both of Boise, Id.

[73] Assignee: Micron Technology, Inc., Boise, Id.

[21] Appl. No.: 09/031,089

[22] Filed: Feb. 26, 1998

[51] Int. Cl.[6] .................... H01L 21/70; H01L 21/8242
[52] U.S. Cl. ..................... 438/397; 438/398; 438/254
[58] Field of Search ...................... 257/350, 347; 438/155, 244, 387, 253, 396, 696, 699, 702, 703, 245, 388, 398, 254, 397

[56] References Cited

U.S. PATENT DOCUMENTS 5,468,979  11/1995  Tani et al. ............................... 257/304
5,811,283   9/1998  Sun ......................................... 438/244

OTHER PUBLICATIONS

S. Wolf and R.N. Tauber, Silicon Processing for the VLSI Era, vol. 1, Lattice Press, pp. 418–421 and 426, 1986.

*Primary Examiner*—Olik Chaudhuri
*Assistant Examiner*—Danie H. Mao
*Attorney, Agent, or Firm*—Wells, St. John, Roberts, Gregory & Matkin, P.S.

[57] ABSTRACT

In one aspect, the invention includes: a) forming a first opening into a substrate surface; b) forming a polysilicon layer over the substrate surface and within the first opening to a thickness which less than completely fills the first opening to leave a second opening within the first opening; c) forming a coating layer over the polysilicon layer and within the second opening; d) etching the coating layer and the polysilicon layer to remove the coating layer and the polysilicon layer from over the substrate surface and leave the coating layer and the polysilicon layer within the opening; and e) after the etching, removing the coating layer from within the opening. In another aspect, the invention includes: a) forming a first opening into a substrate surface; b) forming a polysilicon layer over the substrate surface and within the first opening to a thickness which less than completely fills the first opening to leave a second opening within the first opening, the polysilicon having a surface with a first degree of roughness; c) forming a coating layer over the polysilicon layer and within the second opening, the coating layer having a surface with a second degree of roughness which is less than the first degree of roughness; d) etching the coating layer and the polysilicon layer to remove the coating layer and the polysilicon layer from over the substrate surface and leave the coating layer and the polysilicon layer within the opening; and e) after the etching, removing the coating layer from within the opening.

42 Claims, 5 Drawing Sheets

5,966,611

SEMICONDUCTOR PROCESSING FOR FORMING CAPACITORS BY ETCHING POLYSILICON AND COATING LAYER FORMED OVER THE POLYSILICON

TECHNICAL FIELD

The invention pertains to semiconductor processing methods, such as, for example, methods of forming capacitors.

BACKGROUND OF THE INVENTION

A semiconductor wafer fragment 10 comprising a prior art capacitor construction is illustrated in FIG. 1. Wafer fragment 10 comprises a substrate 12. Substrate 12 can comprise, for example, a monocrystalline silicon wafer lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material layer 14 is formed over substrate 12. Layer 14 can comprise, for example, borophosphosilicate glass (BPSG). An electrical node 16 is formed within substrate 12. Node 16 can comprise, for example, a diffusion region formed by implanting conductivity-enhancing dopant within substrate 12.

An opening extends through layer 14, and a container-type capacitor assembly 20 extends within the opening. Capacitor assembly 20 comprises a storage node 18, a dielectric layer 22, and a capacitor plate 24. Storage node 18 can comprise, for example, conductively-doped rugged polysilicon, wherein rugged polysilicon is defined to encompass hemispherical grain polysilicon and cylindrical grain polysilicon. Dielectric layer 22 typically comprises a composite of silicon oxide and silicon nitride. Capacitor plate 24 typically comprises conductively-doped polysilicon. Storage node 18 is in electrical connection with electrical node 16.

A difficulty in forming capacitor assembly 20 arises in forming storage node 18. Formation of storage node 18 typically comprises providing conductively-doped hemispherical grain polysilicon within the opening and over layer 14. The hemispherical grain polysilicon is subsequently etched to leave the hemispherical grain polysilicon remaining only in the opening. During such etching, conductive polysilicon particulates can be formed. Such particulates can redeposit on wafer 10 to cause shorts in an integrated circuit formed on wafer 10. For instance, it is common in semiconductive processing to form multiple capacitor assemblies 20 on a single semiconductive wafer. Conductive polysilicon particles formed during etching of a hemispherical grain polysilicon layer can redeposit between adjacent capacitor structures to form a short between the capacitor structures. It would be desirable to develop alternative methods for forming a capacitor structure wherein a hemispherical grain polysilicon layer is etched to form a storage node without having conductive polysilicon particles redepositing and shorting electrical components.

SUMMARY OF THE INVENTION

In one aspect, the invention includes a semiconductor processing method wherein a first opening is formed into a substrate surface. A polysilicon layer is formed over the substrate surface and within the first opening to a thickness which less than completely fills the first opening to leave a second opening within the first opening. A coating layer is formed over the polysilicon layer and within the second opening. The coating layer is provided to a thickness which less than completely fills the second opening. The coating layer and the polysilicon layer are etched to remove the coating layer and the polysilicon layer from over the substrate surface and to leave the coating layer and the polysilicon layer within the opening. After the etching, the coating layer is removed from within the opening.

In another aspect, the invention includes a semiconductor processing method wherein a substrate having a surface is provided. A first opening is formed in the substrate and through the surface. A roughened polysilicon layer is formed over the substrate surface and within the first opening. The polysilicon layer is formed to a thickness which less than completely fills the first opening to leave a second opening within the first opening. A coating layer is formed over the polysilicon layer and within the opening. The coating layer and the polysilicon layer are etched to remove the coating layer and the polysilicon layer from over the substrate surface and to leave the coating layer and the polysilicon layer within the opening. After the etching, the coating layer is removed from within the opening.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
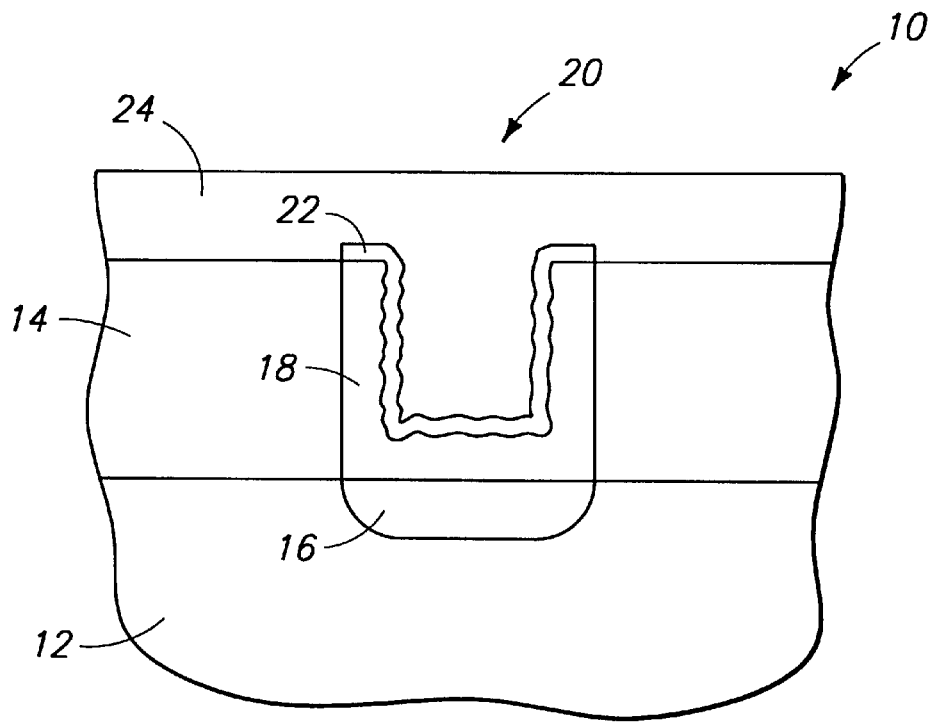
FIG. 1 is a fragmentary, diagrammatic cross-sectional view of a semiconductive wafer fragment comprising a prior art capacitor assembly.
Figure 2:
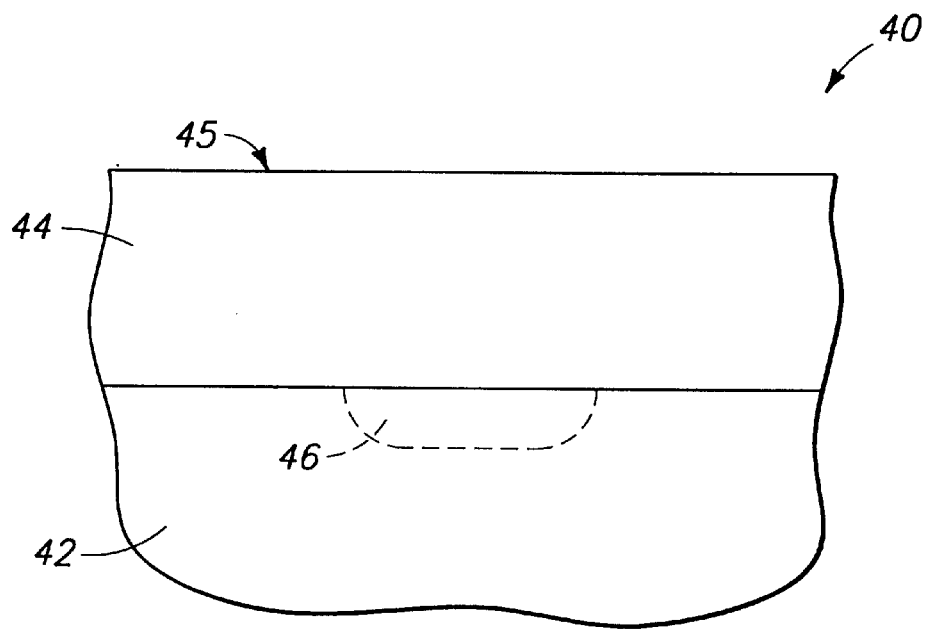
FIG. 2 is a diagrammatic, fragmentary, cross-sectional view of a semiconductive wafer fragment at a preliminary processing step in accordance with a method of the present invention.

A semiconductor processing method of the present invention is described with reference to FIGS. 2–9. Referring to FIG. 2, a semiconductor wafer fragment 40 is shown at a preliminary processing step. Wafer fragment 40 comprises a substrate 42 and a layer 44 overlying substrate 42. Layer 44 comprises an upper surface 45. A node location 46 is defined within substrate 42. Substrate 42 can comprise, for example, monocrystalline silicon lightly doped with a conductivity-enhancing dopant. Layer 44 can comprise, for example, an insulative material, such as BPSG. It is noted that, as discussed above in the background section, the term "substrate" as utilized in this application is a general term. Accordingly, layer 44 can be referred to as a substrate in the claims that follow.

Figure 3:
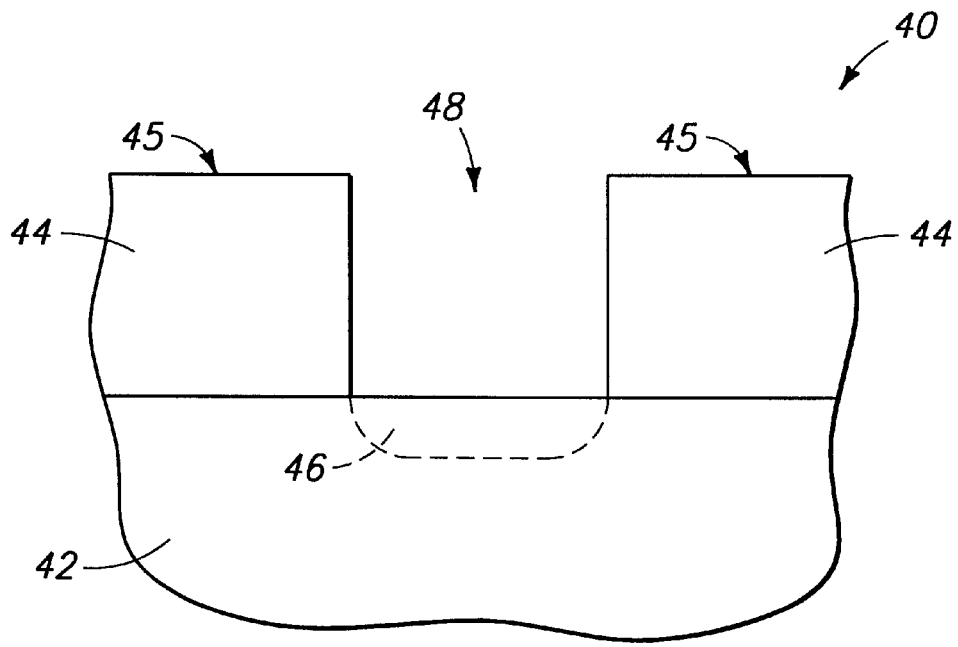
FIG. 3 is a view of the FIG. 2 wafer fragment at a processing step subsequent to that shown in FIG. 2.

Referring to FIG. 3, a first opening 48 is formed through layer 44 and to node location 46. Opening 48 can be formed by conventional methods.

Figure 4:
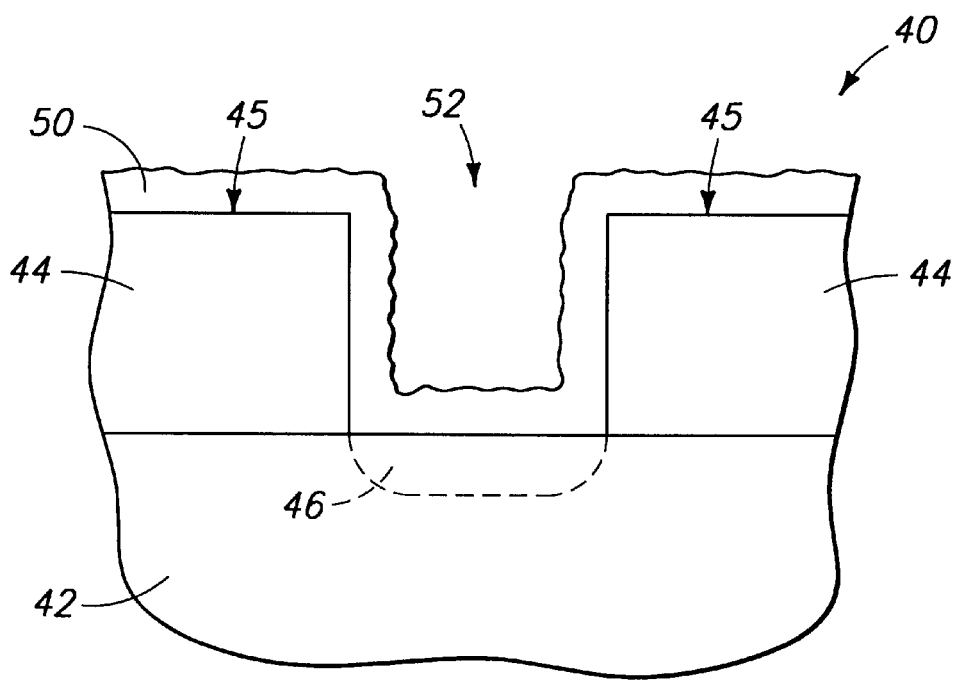
FIG. 4 is a view of the FIG. 2 wafer fragment at a processing step subsequent to that shown in FIG. 3.

Referring to FIG. 4, a semiconductive material layer 50 is formed over layer 44 and within opening 48 (shown in FIG. 3). Layer 50 is formed to a thickness which less than completely fills opening 48 to leave a second opening 52 within first opening 48. Layer 50 preferably comprises polysilicon, and more preferably comprises rugged polysilicon, such as hemispherical grain polysilicon. Layer 50 can be formed by methods known to persons of ordinary skill in the art, such as by chemical vapor deposition of hemispherical grain polysilicon. The deposited polysilicon can be in situ doped, or can be doped subsequently, such as by implanting.

Polysilicon layer 50 contacts node location 46. Node location 46 can be, for example, a conductively doped diffusion region. Such diffusion region can be formed, for example, by implanting conductivity-enhancing dopant into opening 48 (shown in FIG. 3). Alternatively, such diffusion region can be formed at later processing steps, such as, for example, by out-diffusion of conductivity-enhancing dopant from doped polysilicon layer 50.

Figure 5:
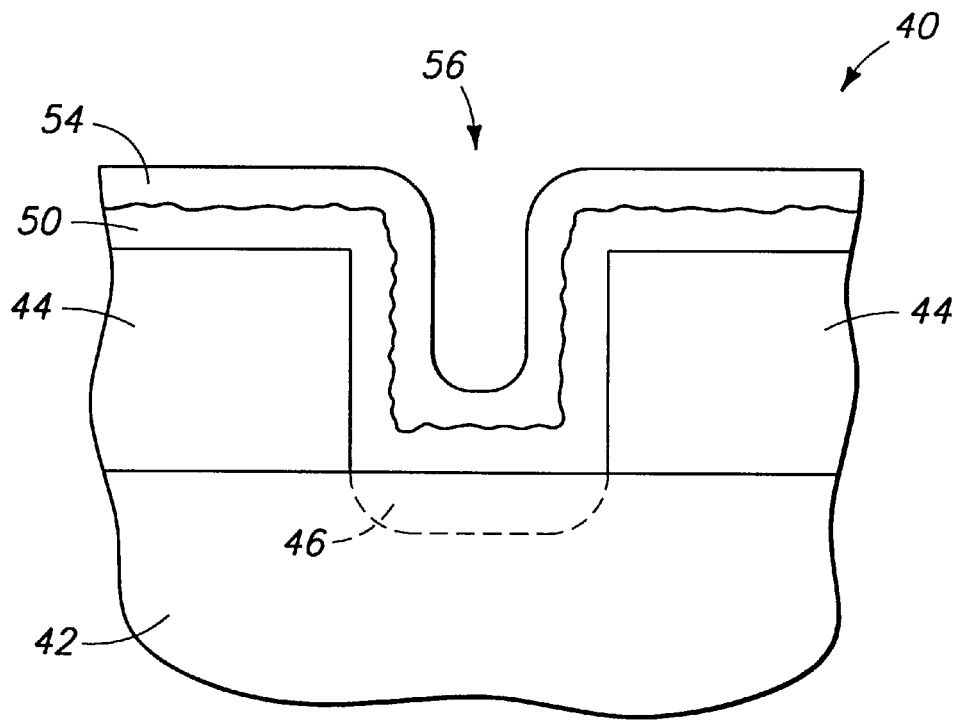
FIG. 5 is a view of the FIG. 2 wafer fragment at a processing step subsequent to that shown in FIG. 4.

Referring to FIG. 5, a coating layer 54 is formed over semiconductive material layer 50 and within second opening 52 (shown in FIG. 4). Coating layer 54 is preferably provided to a thickness which less than completely fills second opening 52 to form a third opening 56 within the second opening. As will become apparent from the discussion below, coating layer 54 is a sacrificial layer. Accordingly, it is preferred to keep layer 54 thin, as it more expedient to remove a thin layer than a thick layer.

In preferred embodiments, wherein semiconductive layer 50 comprises rugged polysilicon, coating layer 54 can comprise either an organic material or an inorganic material. Example inorganic materials are silicon dioxide and other silane oxides ($SiH_4$—$N_2O$). Example organic materials are photoresist and amorphous carbon. Coating layer 54 can, for example, consist essentially of photoresist. If coating layer 54 comprises photoresist, it preferably is applied conformally over an underlying surface and is much thinner than conventional photoresist layers utilized for capacitor fabrication. One method for forming a thinner layer of photoresist is to start with a photoresist having a lower viscosity than the photoresists conventionally utilized for capacitor fabrication. Conventional photoresist utilized for capacitor fabrication typically is applied to be about 9,500 Angstroms thick. A conventional photoresist can comprise, for example, a product marketed as Shipley SPR 950 by Shipley Co. of 455 Forest St., Marlboro, Miss. 01752. In contrast, a coating layer 54 of the present invention preferably is preferably applied to a thickness of less than 3,000 Angstroms, and more preferably of less than 2,500 Angstroms. For instance, the photoresist can be OCG 895 purchased from Olin Microelectronic Materials of Providence, R.I., which is typically provided to a thickness of about 2,200 Angstroms, or AZ BARL from AZ Photoresist Products of Sunnyvale, Calif., which is typically provided to a thickness of about 1,100 Angstroms.

Figure 6:
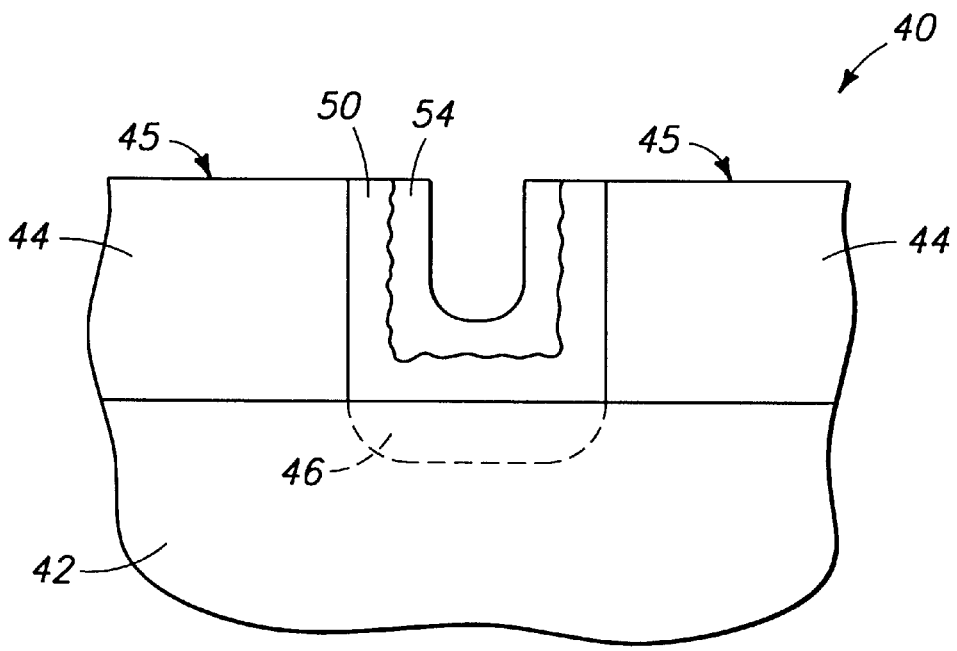
FIG. 6 is a view of the FIG. 2 wafer fragment at a processing step subsequent to that shown in FIG. 5.

Referring to FIG. 6, semiconductive material layer 50 and overlying layer 54 are etched to remove layers 54 and 50 from over insulative material layer 44, and to leave layers 54 and 50 within opening 48 (shown in FIG. 3). The etching preferably removes coating layer 54 and semiconductive material layer 50 at about an equivalent rate. An example etch chemistry for removing photoresist and rugged polysilicon at about a 1:1 rate is to use an etchant comprising $NF_3$, He and $O_2$ (20:14:6) in an Applied Materials 5000 Etch System. If the organic material is amorphous carbon, a similar etch can be used to that described above for photoresist. If the coating layer comprises an oxide, a suitable etch chemistry for achieving approximately equal rates of oxide removal and rugged polysilicon removal utilizes a 50 sccm (standard cubic centimeter per minute) flow of $CF_4$, a 15 sccm flow of $CHF_3$, a pressure of 200 mTorr, and a power of 750 watts in an Applied Materials 5000.

When coating layer 54 and material 50 are removed at a substantially equal rate, coating layer 54 can support particles of layer 50 as the particles are removed. In a preferred process, rugged polysilicon layer 50 comprises a first degree of surface roughness, and coating layer 54 comprises a second degree of surface roughness which is less than the first degree of roughness. Such second degree of roughness can be more easily etched without forming undesired large pieces which can fall back on wafer 40 and interconnect electrical components. Accordingly, etching through the relatively smooth surface of 54 and into layer 50 with an etch that etches the two at a substantially equivalent rate can reduce the amount of large particulate material formed from the etch process.

In alternative embodiments of the invention which are not shown, coating layer 54 can be provided to a thickness which completely fills opening 52 (shown in FIG. 4). Coating layer 54 can then be etched with a rapid removal process to reduce a thickness of layer 54 to less than about 2,300 Angstroms such that layer 54 is reduced to a thickness which less than completely fills opening 52 (shown in FIG. 4) to form third opening 56. A method for rapid removal of an organic material, such as photoresist, utilizes an oxygen plasma ($O_2$) or $O_2$ with a small amount of a fluorine containing gas, such as, for example, $NF_3$ or $CF_4$. A method for rapid removal of an inorganic material, such as silicon dioxide, utilizes a $CF_4/CHF_3$ plasma. After the thickness of layer 54 is reduced, the etch chemistry can be changed to a chemistry which removes material 54 and semiconductive material 50 at an approximately equivalent rate.

Figure 7:
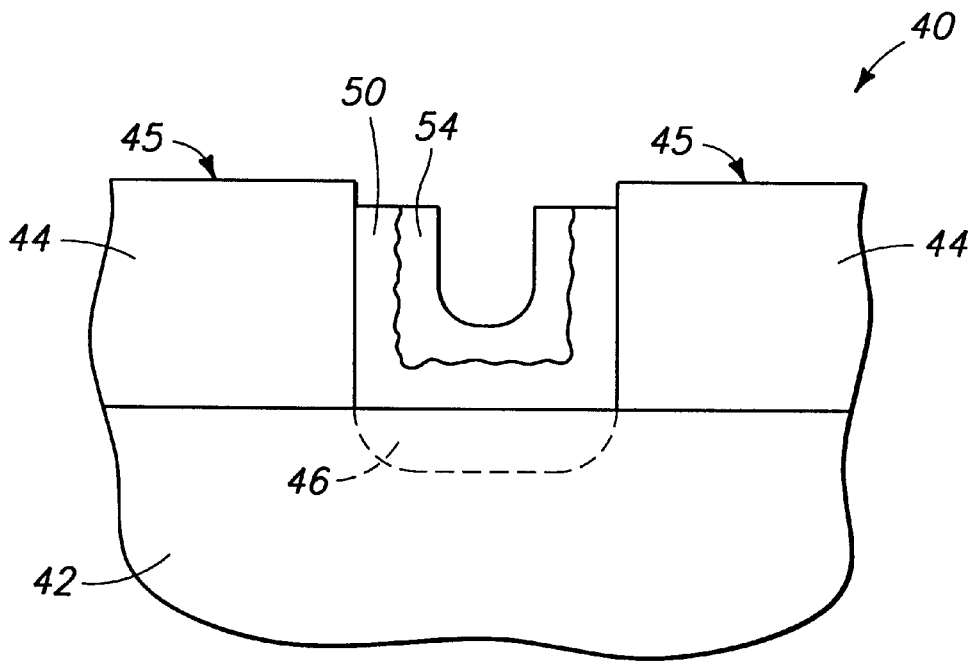
FIG. 7 is a view of the FIG. 2 wafer fragment at a processing step subsequent to that shown in FIG. 6.

The etch of layers 54 and 50 can be monitored by conventional methods to determine when the etch reaches upper surface 45 of layer 44. After upper surface 45 is reached, etching is preferably continued for a limited time to recess layers 50 and 54 beneath upper surface 45, as shown in FIG. 7.

Figure 8:
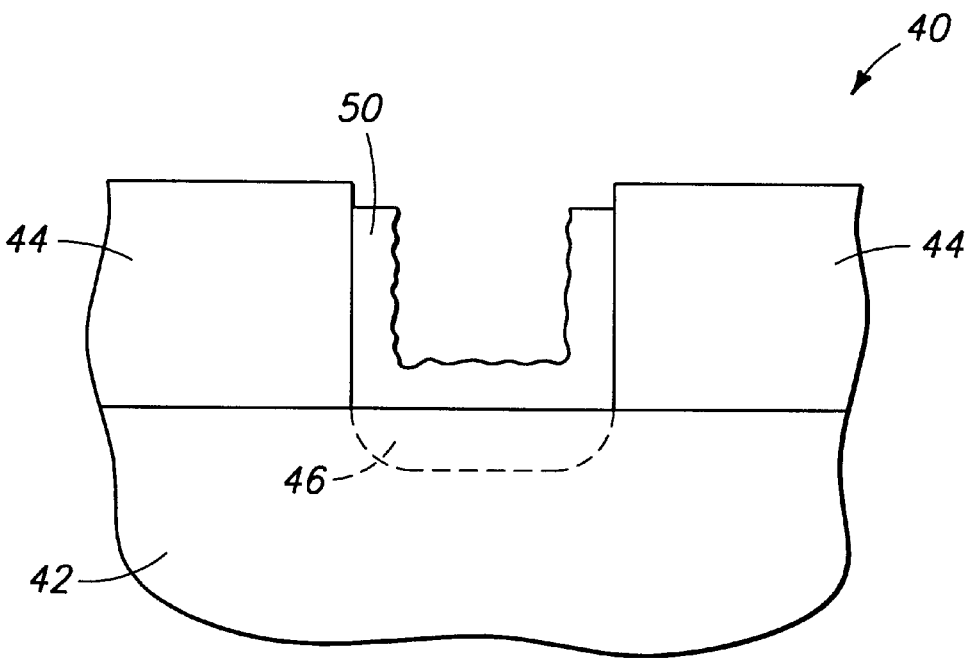
FIG. 8 is a view of the FIG. 2 wafer fragment at a processing step subsequent to that shown in FIG. 7.

Referring to FIG. 8, coating layer 54 is selectively removed relative to semiconductive material layer 50. A method for selectively removing a photoresist layer 54 relative to a polysilicon layer 50 is oxygen plasma etching. A method for selectively removing an amorphous carbon layer 54 relative to a polysilicon layer 50 is oxygen plasma ashing. A method for selectively removing a silicon dioxide layer 54 relative to a polysilicon layer 50 is a hydrofluoric acid bath.

Figure 9:
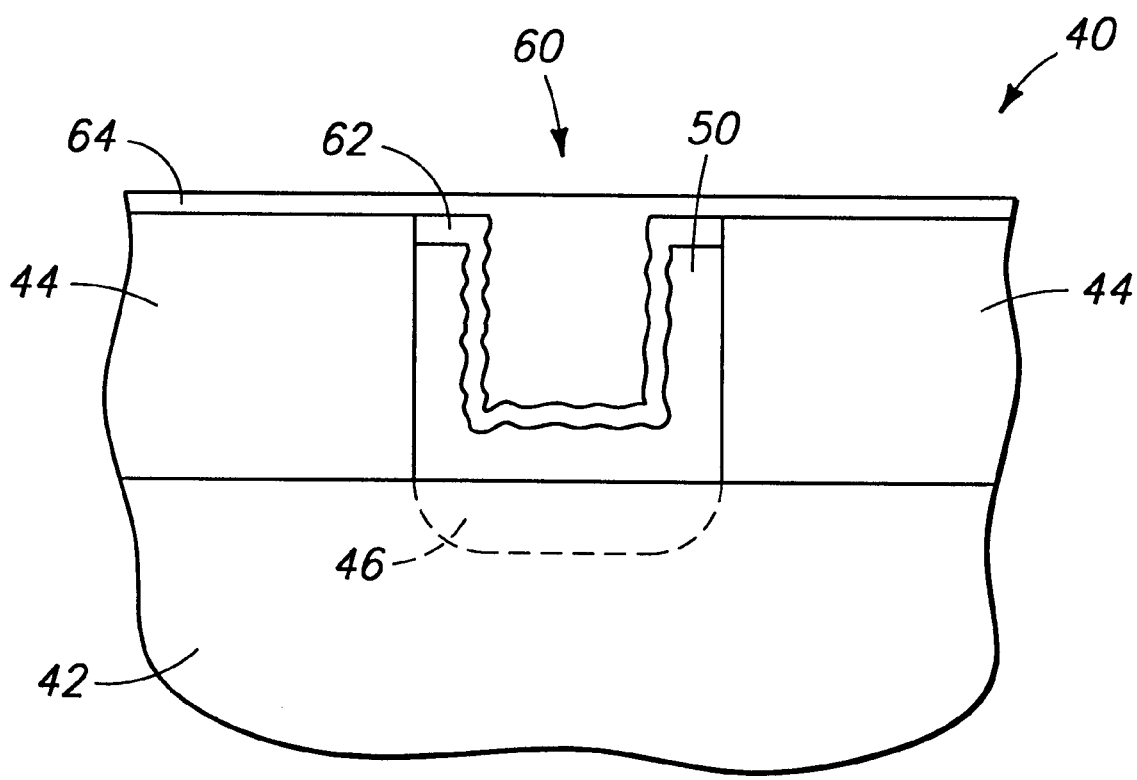
FIG. 9 is a view of the FIG. 2 wafer fragment at a processing step subsequent to that shown in FIG. 8.

Referring to FIG. 9, semiconductive material layer 50 is incorporated into a capacitor construction 60. Specifically, a dielectric layer 62 is formed over layer 50, and an overlying capacitor plate 64 is formed over dielectric layer 62. In the shown capacitor construction 60, semiconductive material layer 50 is a capacitor storage node. Dielectric layer 62 and cell plate layer 64 can be formed by conventional methods. Storage node 50 is in electrical contact with electrical node location 46. Electrical node location 46 can be in electrical contact with other components of an integrated circuit (not shown) on wafer 40 to electrically interconnect capacitor assembly 60 with such other electrical components.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method comprising:
   forming a first opening into a substrate surface;
   forming a polysilicon layer over the substrate surface and within the first opening to a thickness which less than completely fills the first opening to leave a second opening within the first opening;
   forming a coating layer over the polysilicon layer and within the second opening, the coating layer being provided to a thickness which less than completely fills the second opening;
   etching the coating layer and the polysilicon layer to remove the coating layer and the polysilicon layer from over the substrate surface and leave the coating layer and the polysilicon layer within the opening; and
   after the etching, removing the coating layer from within the opening.

2. The method of claim 1 wherein the coating layer comprises an organic material.

3. The method of claim 1 wherein the coating layer comprises an inorganic material.

4. The method of claim 1 wherein the coating layer comprises silicon dioxide.

5. The method of claim 1 wherein the coating layer comprises photoresist.

6. The method of claim 1 wherein the coating layer comprises amorphous carbon.

7. The method of claim 1 wherein the coating layer consists essentially of photoresist.

8. The method of claim 1 wherein the etching removes the coating layer and the polysilicon layer at about a same rate.

9. A semiconductor processing method comprising:
   forming a first opening into a substrate surface;
   forming a semiconductive material layer over the substrate surface and within the first opening to a thickness which less than completely fills the first opening to leave a second opening within the first opening;
   forming a coating layer over the semiconductive material layer and within the second opening, the coating layer being formed to a thickness of less than 3000 Angstroms, and less than completely filling the second opening;
   etching the coating layer and the semiconductive material layer to remove the coating layer and the semiconductive material layer from over the substrate surface and leave the coating layer and the semiconductive material layer within the opening; and
   after the etching, removing the coating layer from within the opening.

10. A semiconductor processing method comprising:
    forming a first opening into a substrate surface;
    forming a polysilicon layer over the substrate surface and within the first opening to a thickness which less than completely fills the first opening to leave a second opening within the first opening, the polysilicon having a surface with a first degree of roughness;
    forming a coating layer over the polysilicon layer and within the second opening, the coating layer having a surface with a second degree of roughness which is less than the first degree of roughness;
    etching the coating layer and the polysilicon layer to remove the coating layer and the polysilicon layer from over the substrate surface and leave the coating layer and the polysilicon layer within the opening; and
    after the etching, removing the coating layer from within the opening.

11. The method of claim 10 wherein the coating layer is formed to a thickness of less than 3000 Angstroms.

12. The method of claim 10 wherein the coating layer comprises an organic material.

13. The method of claim 10 wherein the coating layer comprises an inorganic material.

14. The method of claim 10 wherein the coating layer comprises silicon dioxide.

15. The method of claim 10 wherein the coating layer comprises photoresist or amorphous carbon.

16. The method of claim 10 wherein the coating layer consists essentially of photoresist.

17. The method of claim 10 wherein the etching etches the coating layer and the polysilicon layer at about a same rate.

18. The method of claim 10 wherein the coating layer comprises silicon dioxide, and wherein the etching comprising etching with an etchant comprising $CF_4$ and $CHF_3$.

19. The method of claim 10 wherein the coating layer comprises photoresist; and wherein the etching comprising etching with an etchant comprising $NF_3$, He and $O_2$.

20. The method of claim 10 wherein the etching etches the coating layer and the polysilicon layer within the opening to a level beneath the substrate surface.

21. The method of claim 10 wherein the coating layer is provided to a thickness which less than completely fills the second opening.

22. The method of claim 10 wherein the coating layer is provided to a thickness which completely fills the second opening; the method further comprising, before etching the polysilicon layer and the coating layer, removing some of the coating layer from within the second opening.

23. The method of claim 10 wherein the coating layer is provided to a thickness which completely fills the second opening and wherein the etching comprises:
    etching the coating layer faster than the polysilicon to reduce a thickness of the coating layer to less than about 2300 Angstroms; and
    after etching the coating layer to a thickness of less than about 2300 Angstroms, etching the coating layer and the polysilicon layer at about a same rate.

24. The method of claim 10 wherein the coating layer comprises photoresist and is provided to a thickness which completely fills the second opening and wherein the etching comprises:
    etching the coating layer with $O_2$ to etch the coating layer faster than the polysilicon, the etching reducing a thickness of the coating layer to less than about 2300 Angstroms; and after etching the coating layer to a thickness of less than about 2300 Angstroms, etching the coating layer and the polysilicon layer at about a same rate with an etchant comprising $NF_3$, He and $O_2$.

25. The method of claim 10 wherein the coating layer comprises oxide and is provided to a thickness which completely fills the second opening and wherein the etching comprises:

etching the coating layer with $CF_4$ and $CHF_3$ to etch the coating layer faster than the polysilicon, the etching reducing a thickness of the coating layer to less than about 2300 Angstroms; and after etching the coating layer to a thickness of less than about 2300 Angstroms, etching the coating layer and the polysilicon layer at about a same rate with an etchant comprising $CF_4$.

26. A semiconductor processing method comprising:

providing a substrate having a surface;

forming a first opening in the substrate and through the surface;

forming a roughened polysilicon layer over the substrate surface and within the first opening, the polysilicon layer being formed to a thickness which less than completely fills the first opening to leave a second opening within the first opening;

forming a coating layer over the polysilicon layer and within the second opening;

etching the coating layer and the polysilicon layer to entirely remove the coating layer and the polysilicon layer from over the substrate surface and leave the coating layer within the second opening and the polysilicon layer within the first opening, wherein the etching etches the coating layer and the polysilicon layer at about a same rate; and after the etching, removing the coating layer from within the second opening.

27. The method of claim 26 wherein the coating layer comprises an organic material.

28. The method of claim 26 wherein the coating layer comprises an inorganic material.

29. A semiconductor processing method comprising:

providing a substrate having a surface;

forming a first opening in the substrate and through the surface;

forming a roughened polysilicon layer over the substrate surface and within the first opening, the polysilicon layer being formed to a thickness which less than completely fills the first opening to leave a second opening within the first opening;

forming a coating layer over the polysilicon layer and within the second opening, the coating layer comprising silicon dioxide;

etching the coating layer and the polysilicon layer to entirely remove the coating layer and the polysilicon layer from over the substrate surface and leave the polysilicon layer within the first opening and the coating layer within the second opening wherein the etching etches the coating layer and the polysilicon layer at about a same rate; and after the etching, removing the coating layer from within the second opening.

30. The method of claim 26 wherein the coating layer comprises photoresist or amorphous carbon.

31. The method of claim 26 wherein the etching etches the coating layer within the second opening, and the roughened polysilicon layer within the first opening to a level beneath the substrate surface.

32. A semiconductor processing method comprising:

providing a substrate having a surface;

forming a first opening in the substrate and through the surface;

forming a roughened polysilicon layer over the substrate surface and within the first opening, the polysilicon layer being formed to a thickness which less than completely fills the first opening to leave a second opening within the first opening;

forming a coating layer over the polysilicon layer and within the second opening, the coating layer being provided to a thickness which less than completely fills the second opening;

etching the coating layer and the polysilicon layer to remove the coating layer and the polysilicon layer from over the substrate surface and leave the polysilicon layer within the first opening and the coating layer within the second opening; and after the etching, removing the coating layer from within the second opening.

33. A semiconductor processing method comprising:

providing a substrate having a surface;

forming a first opening in the substrate and through the surface;

forming a roughened polysilicon layer over the substrate surface and within the first opening, the polysilicon layer being formed to a thickness which less than completely fills the first opening to leave a second opening within the first opening;

forming a coating layer over the polysilicon layer and within the second opening, the coating layer being provided to a thickness which completely fills the second opening;

etching the coating layer with a first etch that removes the coating layer more rapidly than the polysilicon layer to reduce a thickness of the coating layer;

after reducing the thickness of the coating layer, etching the coating layer and the polysilicon layer with a second etch to remove the coating layer and the polysilicon layer from over the substrate surface and leave the polysilicon layer within the first opening and the coating layer within the second opening; and after the etching, removing the coating layer from within the second opening.

34. A method of forming a capacitor comprising:

providing a substrate having a surface;

forming a first opening in the substrate and through the surface;

forming a roughened polysilicon layer over the substrate surface and within the first opening, the polysilicon layer being formed to a thickness which less than completely fills the first opening to leave a second opening within the first opening;

forming a coating layer over the polysilicon layer and within the second opening;

etching the coating layer and the polysilicon layer to remove the coating layer and the polysilicon layer from over the substrate surface and leave the coating layer within the second opening and the polysilicon layer within the first opening, wherein the etching etches the coating layer and the polysilicon layer at about a same rate;

after the etching, removing the coating layer from within the second opening to leave the roughened polysilicon within the first opening, the roughened polysilicon within the first opening being a storage node;

forming a dielectric layer over the storage node;

forming a capacitor plate over the dielectric layer; and providing an electrical node in electrical contact with the storage node.

35. The method of claim 34 wherein the coating layer comprises an organic material.

36. The method of claim 34 wherein the coating layer comprises an inorganic material.

37. The method of claim 34 wherein the coating layer comprises silicon dioxide.

38. The method of claim 34 wherein the coating layer comprises photoresist.

39. The method of claim 34 wherein the coating layer comprises amorphous carbon.

40. The method of claim 34 wherein the etching etches the coating layer and the roughened polysilicon layer within the opening to a level beneath the substrate surface.

41. The method of claim 34 wherein the coating layer is provided to a thickness which less than completely fills the second opening.

42. The method of claim 34 wherein the coating layer is provided to a thickness which completely fills the second opening; the method further comprising, before etching the polysilicon layer and the coating layer, removing some of the coating layer from within the second opening.

* * * * *